(12) United States Patent
Sundaram et al.

(10) Patent No.: US 11,908,715 B2
(45) Date of Patent: Feb. 20, 2024

(54) DYNAMIC TEMPERATURE CONTROL OF SUBSTRATE SUPPORT IN SUBSTRATE PROCESSING SYSTEM

(71) Applicant: LAM RESEARCH CORPORATION, Fremont, CA (US)

(72) Inventors: Sairam Sundaram, E Niskayuna, NY (US); Aaron Durbin, Portland, OR (US); Ramesh Chandrasekharan, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 541 days.

(21) Appl. No.: 17/256,677

(22) PCT Filed: Jul. 2, 2019

(86) PCT No.: PCT/US2019/040416
§ 371 (c)(1),
(2) Date: Dec. 29, 2020

(87) PCT Pub. No.: WO2020/010153
PCT Pub. Date: Jan. 9, 2020

(65) Prior Publication Data
US 2021/0272828 A1    Sep. 2, 2021

Related U.S. Application Data

(60) Provisional application No. 62/694,171, filed on Jul. 5, 2018.

(51) Int. Cl.
*H01L 21/31*  (2006.01)
*H01L 21/469* (2006.01)
(Continued)

(52) U.S. Cl.
CPC .. *H01L 21/67248* (2013.01); *H01L 21/68714* (2013.01)

(58) Field of Classification Search
CPC ......... H01L 21/67248; H01L 21/68714; H01L 21/67103; H01L 21/67109;
(Continued)

(56) References Cited

U.S. PATENT DOCUMENTS 4,780,120 A    10/1988  Varrasso et al.
5,071,459 A    12/1991  Kuhn
(Continued)

FOREIGN PATENT DOCUMENTS

CN    101641150 A    2/2010
CN    103828031 A    5/2014
(Continued)

OTHER PUBLICATIONS

International Search Report and Written Opinion issued in PCT/US2019/040416, dated Oct. 23, 2019; ISA/KR.
(Continued)

*Primary Examiner* — Niki H Nguyen

(57) ABSTRACT

A temperature-controlled substrate support for a substrate processing system includes a substrate support located in the processing chamber. The substrate support includes N zones and N resistive heaters, respectively, where N is an integer greater than one. A temperature sensor is located in one of the N zones. A controller is configured to calculate N resistances of the N resistive heaters during operation and to adjust power to N−1 of the N resistive heaters during operation of the substrate processing system in response to the temperature measured in the one of the N zones by the temperature sensor, the N resistances of the N resistive heaters, and N−1 resistance ratios.

23 Claims, 8 Drawing Sheets

(51) Int. Cl.
*H01L 21/67* (2006.01)
*H01L 21/687* (2006.01)

(58) Field of Classification Search
CPC ........... H01L 21/67098; H01L 21/6833; H01L 21/6835; H01L 21/02274; H01L 21/02164; H01L 21/6831; H01L 2924/0002; H01L 21/02129; H01L 21/02301; H01L 21/205; H01L 21/02271; H01L 21/0228; H01L 21/0234; H01L 21/67017; H01L 21/31116; H01L 21/31625; H01L 2924/00; H01L 21/02315; H01L 21/2255; H01L 21/76843; H01L 21/3065; H01L 21/67069; H01L 21/683; H01L 21/02; H01L 21/0217; H01L 21/02312; H01L 21/28562; H01L 2924/1461; H01L 31/0725; H01L 31/0735; H01L 21/0274; H01L 28/20; H01L 29/4908; H01L 2924/3011; H01L 21/02115; H01L 21/0332; H01L 21/20; H01L 21/31122; H01L 21/31612; H01L 21/6719; H01L 21/67225; H01L 2224/48091; H01L 29/0665; H01L 29/0673; H01L 29/66439; H01L 21/02205; H01L 21/67011; H01L 21/76862; H01L 2924/01047; H01L 21/00; H01L 21/2855; H01L 21/68; H01L 21/76871; H01L 21/76877; H01L 29/78603; H01L 2224/48247
See application file for complete search history.

(56) References Cited

U.S. PATENT DOCUMENTS

| | | | |
|---|---|---|---|
| 5,126,533 A | 6/1992 | Newman et al. | |
| 5,280,422 A | 1/1994 | Moe et al. | |
| 5,521,850 A | 5/1996 | Moe et al. | |
| 5,552,998 A | 9/1996 | Datta | |
| 5,968,379 A | 10/1999 | Zhao et al. | |
| 5,974,816 A | 11/1999 | Endo | |
| 6,072,163 A | 6/2000 | Armstrong et al. | |
| 6,235,563 B1 | 5/2001 | Oka et al. | |
| 6,270,638 B1* | 8/2001 | Kaneko | G01N 27/4065 219/486 |
| 6,627,859 B1 | 9/2003 | Kasai et al. | |
| 6,775,471 B2 | 8/2004 | Blersch et al. | |
| 6,783,630 B2 | 8/2004 | Shajii et al. | |
| 6,897,411 B2 | 5/2005 | Beer et al. | |
| 6,951,587 B1 | 10/2005 | Narushima | |
| 7,189,946 B2 | 3/2007 | Goto et al. | |
| 7,196,295 B2 | 3/2007 | Fennewald et al. | |
| 7,705,275 B2 | 4/2010 | Umotoy et al. | |
| 8,405,005 B2 | 3/2013 | Zucker et al. | |
| 8,552,346 B2 | 10/2013 | Ambal et al. | |
| 8,772,682 B2 | 7/2014 | Ambal et al. | |
| 9,123,755 B2 | 9/2015 | Swanson et al. | |
| 9,334,566 B2 | 5/2016 | Chandrasekharan et al. | |
| 9,490,150 B2 | 11/2016 | Tzu et al. | |
| 9,775,194 B2 | 9/2017 | Pease et al. | |
| 10,633,742 B2 | 4/2020 | Durbin et al. | |
| 11,028,482 B2 | 6/2021 | Durbin et al. | |
| 11,183,400 B2 | 11/2021 | Chandrasekharan et al. | |
| 11,236,422 B2 | 2/2022 | Roberts et al. | |
| 2002/0125239 A1 | 9/2002 | Chen et al. | |
| 2003/0062359 A1 | 4/2003 | Ho et al. | |
| 2005/0028736 A1* | 2/2005 | Long | H01J 37/3244 118/715 |
| 2005/0194374 A1 | 9/2005 | Gelatos et al. | |
| 2005/0258160 A1 | 11/2005 | Goto et al. | |
| 2006/0065654 A1 | 3/2006 | Ptasienski | |
| 2006/0284722 A1 | 12/2006 | Bernier | |
| 2007/0006936 A1 | 1/2007 | Hosokawa et al. | |
| 2007/0218200 A1 | 9/2007 | Suzuki et al. | |
| 2008/0078744 A1 | 4/2008 | Wang et al. | |
| 2008/0224817 A1 | 9/2008 | Vellore et al. | |
| 2009/0159566 A1 | 6/2009 | Brillhart et al. | |
| 2010/0193501 A1 | 8/2010 | Zucker et al. | |
| 2010/0267248 A1 | 10/2010 | Ma et al. | |
| 2011/0092072 A1 | 4/2011 | Singh et al. | |
| 2011/0143462 A1 | 6/2011 | Gaff et al. | |
| 2011/0299562 A1 | 12/2011 | Hashemian | |
| 2012/0048467 A1 | 3/2012 | Mahadeswaraswamy et al. | |
| 2012/0118225 A1* | 5/2012 | Hsu | H01L 21/67248 118/667 |
| 2012/0208371 A1 | 8/2012 | Rogers et al. | |
| 2012/0258602 A1 | 10/2012 | Subramani et al. | |
| 2012/0292305 A1 | 11/2012 | Ambal et al. | |
| 2013/0037532 A1 | 2/2013 | Volfovski et al. | |
| 2013/0180963 A1 | 7/2013 | Zhang et al. | |
| 2013/0220989 A1 | 8/2013 | Pease et al. | |
| 2013/0270252 A1 | 10/2013 | Ambal et al. | |
| 2014/0083361 A1 | 3/2014 | Rocha-Alvarez et al. | |
| 2014/0154819 A1 | 6/2014 | Gaff et al. | |
| 2014/0220710 A1 | 8/2014 | Aderhold et al. | |
| 2014/0251214 A1 | 9/2014 | Cuvalci et al. | |
| 2015/0083042 A1 | 3/2015 | Kobayashi et al. | |
| 2015/0089961 A1 | 4/2015 | Duzly et al. | |
| 2015/0170977 A1 | 6/2015 | Singh | |
| 2015/0253051 A1 | 9/2015 | Jin et al. | |
| 2016/0079039 A1 | 3/2016 | Dhindsa et al. | |
| 2016/0148803 A1 | 5/2016 | Wu et al. | |
| 2016/0345384 A1 | 11/2016 | Zhang et al. | |
| 2016/0379851 A1 | 12/2016 | Swaminathan et al. | |
| 2017/0140954 A1 | 5/2017 | Kitagawa et al. | |
| 2017/0215230 A1 | 7/2017 | Parkhe | |
| 2017/0229327 A1 | 8/2017 | Singh et al. | |
| 2017/0236733 A1 | 8/2017 | Leeser | |
| 2017/0280509 A1 | 9/2017 | Takebayashi | |
| 2017/0309510 A1 | 10/2017 | Maehata et al. | |
| 2017/0363663 A1 | 12/2017 | Breitlow et al. | |
| 2017/0365443 A1 | 12/2017 | Carducci et al. | |
| 2017/0372928 A1* | 12/2017 | Yamada | H05B 1/0233 |
| 2018/0090306 A1 | 3/2018 | Higashijima et al. | |
| 2018/0124870 A1 | 5/2018 | Ohse et al. | |
| 2018/0190529 A1 | 7/2018 | Takebayashi et al. | |
| 2018/0246163 A1 | 8/2018 | Kwak et al. | |
| 2018/0337074 A1 | 11/2018 | Samir et al. | |
| 2018/0348265 A1 | 12/2018 | Hopkins-Breitlow et al. | |
| 2022/0037170 A1* | 2/2022 | Chandrasekharan | H01L 21/67248 |

FOREIGN PATENT DOCUMENTS

| | | |
|---|---|---|
| CN | 107039310 A | 8/2017 |
| CN | 107393847 A | 11/2017 |
| JP | H07153550 A | 6/1995 |
| JP | H10116885 A | 5/1998 |
| JP | 2000235886 A | 8/2000 |
| JP | 2000339039 A | 12/2000 |
| JP | 2002319525 A | 10/2002 |
| JP | 2004044579 A | 2/2004 |
| JP | 2007335425 A | 12/2007 |
| JP | 5567318 B2 | 8/2014 |
| JP | 2016001688 A | 1/2016 |
| JP | 2016192566 A | 11/2016 |
| JP | 2017076691 A | 4/2017 |
| JP | 2017228230 A | 12/2017 |
| JP | 2020009795 A | 1/2020 |
| KR | 20080008933 A | 1/2008 |
| KR | 20080070360 A | 7/2008 |
| KR | 20090003703 U | 4/2009 |
| KR | 20170013185 A | 2/2017 |
| KR | 20170088352 A | 8/2017 |
| KR | 20180035151 A | 4/2018 |
| TW | 201029066 A | 8/2010 |
| TW | 201312690 A | 3/2013 |
| TW | 201721802 A | 6/2017 |
| TW | 201809944 A | 3/2018 |
| WO | WO-2014113230 A1 | 7/2014 |

(56) References Cited

FOREIGN PATENT DOCUMENTS

| WO | WO-2017029876 A1 | 2/2017 |
|----|------------------|--------|
| WO | WO-2018016384 A1 | 1/2018 |
| WO | WO-2019078036 A1 | 4/2019 |

OTHER PUBLICATIONS

U.S. Appl. No. 62/694,171, filed Jul. 5, 2018, in the names of Sairam Sundaram et al.; & entitled "Dynamic Temperature Control of Substrate Support in Substrate Processing System". pp. 1-14. (Year 2018).
International Search Report and Written Opinion corresponding to PCT/US2019/030366 dated Aug. 13, 2019, 13 pages.
International Search Report and Written Opinion corresponding to PCT/US2019/045093 dated Nov. 15, 2019, 14 pages.
International Search Report and Written Opinion corresponding to PCT/US2019/045097 dated Dec. 20, 2019, 11 pages.
International Search Report and Written Opinion corresponding to PCT/US2018/061542 dated Mar. 8, 2019, 10 pages.
Rendon, G., et al,. "A Simple Substrate Heater Device With Temperature Controller for Thin Film Preparation". Journal of Applied Research and Technology, vol. 10, Aug. 2012, pp. 549-556.
Patil, Nagesh D., et al., "Effects of Substrate Heating and Wettability on Evaporation Dynamics and Deposition Patterns for a Sessile Water Droplet Containing Colloidal Particles". Langmuir, 2016, 32, 11958-11972.
Rousseau, B., et al., "Resistive substrate heater for film processing by spray pyrolysis". Review of Scientific Instruments, vol. 75, No. 9, Sep. 2004, pp. 2884-2887.
Chinese Office Action for Chinese Application No. 201980045350.0 dated Oct. 10, 2022.
Taiwanese Office Action for Application No. 108127980 dated May 2, 2023.
Taiwanese Office Action for Taiwanese Application No. 108123550 dated Feb. 3, 2023.
Chinese Office Action for Chinese Application No. 201980045350.0 dated Apr. 29, 2023.
Taiwanese Office Action for Taiwanese Application No. 108127980 dated May 2, 2023.
Perez, Israel, et al. "Design and construction of a compact rotary substrate heater for deposition systems". Can. J. Phys. 98: 1009-1014 (2020) dx.doi.org/10.1139/cjp-2019-0530.
Korean Office Action for corresponding Korean Application No. 10-2020-7017337 dated Jul. 26, 2023.
International Search Report and Written Opinion corresponding to PCT/US2019/051886 dated Mar. 24, 2020, 11 pages.

\* cited by examiner

DYNAMIC TEMPERATURE CONTROL OF SUBSTRATE SUPPORT IN SUBSTRATE PROCESSING SYSTEM

CROSS-REFERENCE TO RELATED APPLICATIONS

This application is a U.S. National Phase Application under 35 U.S.C. 371 of International Application No. PCT/US2019/040416, filed on Jul. 2, 2019, which claims the benefit of U.S. Provisional Application No. 62/694,171, filed on Jul. 5, 2018. The entire disclosures of the applications referenced above are incorporated herein by reference.

FIELD

The present disclosure relates to substrate processing systems, and more particularly to substrate processing systems including dynamic temperature control of a substrate support.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, chemical vapor deposition (CVD), plasma enhanced chemical vapor deposition (PECVD), atomic layer deposition (ALD), atomic layer etch (ALE), plasma enhanced atomic layer deposition (PEALD) and/or other etch, deposition, and cleaning processes. During processing, a substrate is arranged on a substrate support, such as a pedestal, an electrostatic chuck (ESC), etc. in a processing chamber of the substrate processing system. A process gas mixture is introduced into the processing chamber to treat the substrate. In some examples, plasma may be struck to enhance chemical reactions within the processing chamber.

During substrate processing, the temperature of the substrate may be controlled by resistance heaters that are arranged in the substrate support. In some examples, the resistance heaters are arranged into two or more zones that are controlled separately. Maintaining thermal uniformity in the zones that are heated by the resistance heaters usually requires either direct temperature measurement in each zone or individually calibrated indirect temperature measurement (e.g. via a known dependence of heater resistance with temperature).

SUMMARY

A temperature-controlled substrate support for a substrate processing system includes a substrate support located in the processing chamber. The substrate support includes N zones and N resistive heaters, respectively, where N is an integer greater than one. A temperature sensor is located in one of the N zones. A controller is configured to calculate N resistances of the N resistive heaters during operation and to adjust power to N−1 of the N resistive heaters during operation of the substrate processing system in response to the temperature measured in the one of the N zones by the temperature sensor, the N resistances of the N resistive heaters, and N−1 resistance ratios.

In other features, the N−1 resistance ratios are determined by measuring the N resistances of the N resistive heaters in the N zones, respectively, when the substrate support is at a uniform temperature and dividing N−1 of the N resistances of N−1 of the N zones by one of the N resistances corresponding to the one of the N zones.

In other features, the uniform temperature corresponds to ambient temperature. The N−1 zones do not include temperature sensors. The controller calculates the N resistances of the N resistive heaters during operation by monitoring N voltages supplied to the N resistive heaters, respectively; and calculating the N resistances based on the N voltages supplied to the N resistive heaters, respectively.

In other features, the controller calculates the N resistances of the N resistive heaters during operation by monitoring N currents supplied to the N resistive heaters, respectively; and calculating the N resistances based on the N currents supplied to the N resistive heaters, respectively.

In other features, the controller calculates the N resistances of the N resistive heaters during operation by monitoring N currents and N voltages supplied to the N resistive heaters, respectively; and calculating the N resistances based on the N currents and the N voltages supplied to the N resistive heaters, respectively.

In other features, the controller is configured to control power to the one of the N zones based on the temperature measured by the temperature sensor.

A method of manufacturing a substrate support of a substrate processing system includes embedding N resistive heaters in N zones of a substrate support; embedding a temperature sensor in one of the N zones of the substrate support; measuring N resistances of the N resistive heaters in the N zones of the substrate support; determining N−1 resistance ratios based on the N resistances; connecting a controller to the N resistive heaters and the temperature sensor; and programming the controller to control temperature in N−1 of the N resistive heaters in N−1 of the N zones, respectively, during operation of the substrate processing system in response to a measured temperature in the one of the N zones, the N resistances of the N resistive heaters, and the N−1 resistance ratios.

In other features, the N−1 resistance ratios are calculated by determining the N resistances of the N resistive heaters, respectively, when the substrate support is at a uniform temperature; and dividing the N−1 of the N resistances of the N−1 of the N zones by one of the N resistances corresponding to the one of the N zones.

In other features, the uniform temperature corresponds to ambient temperature. The N−1 of the N zones do not include temperature sensors. Measuring the N resistances of the N resistive heaters includes monitoring N voltages supplied to the N resistive heaters, respectively; and calculating the N resistances based on the N voltages supplied to the N resistive heaters, respectively.

In other features, measuring the N resistances of the N zones includes monitoring N currents supplied to the N resistive heaters, respectively; and calculating the N resistances based on the N currents supplied to the N resistive heaters, respectively.

In other features, measuring the N resistances of the N zones during operation includes monitoring N currents and N voltages supplied to N resistive heaters, respectively; and calculating the N resistances based on the N currents and the N voltages supplied to the N resistive heaters, respectively.

A method for controlling temperatures of zones in a substrate support of a substrate processing system includes measuring temperature in one of N zones of a substrate support during operation of the substrate processing system using a temperature sensor located in the one of the N zones, where N is an integer greater than one; measuring N resistances of N resistive heaters located in the N zones, respectively, during operation of the substrate processing system; and adjusting power to N−1 of the N resistive heaters in N−1 of the N zones, respectively, during operation of the substrate processing system to control temperatures in N−1 of the N zones in response to the measured temperature in the one of the N zones, the N resistances of the N resistive heaters, and N−1 resistance ratios.

In other features, the N−1 resistance ratios are calculated by determining the N resistances of the N resistive heaters, respectively, when the substrate support is at a uniform temperature; and dividing N−1 of the N resistances of N−1 of the N zones by one of the N resistances corresponding to the one of the N zones.

In other features, the uniform temperature corresponds to ambient temperature. The N−1 of the N zones do not include temperature sensors. Measuring the N resistances of the N resistive heaters includes monitoring N voltages supplied to the N resistive heaters, respectively; and calculating the N resistances based on the N voltages supplied to the N resistive heaters, respectively.

In other features, measuring the N resistances of the N zones includes monitoring N currents supplied to the N resistive heaters, respectively; and calculating the N resistances based on the N currents supplied to the N resistive heaters, respectively.

In other features, measuring the N resistances of the N zones during operation includes monitoring N currents and N voltages supplied to N resistive heaters, respectively; and calculating the N resistances based on the N currents and the N voltages supplied to the N resistive heaters, respectively.

In other features, the method includes controlling power to the one of the N zones based on the temperature measured by the temperature sensor.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
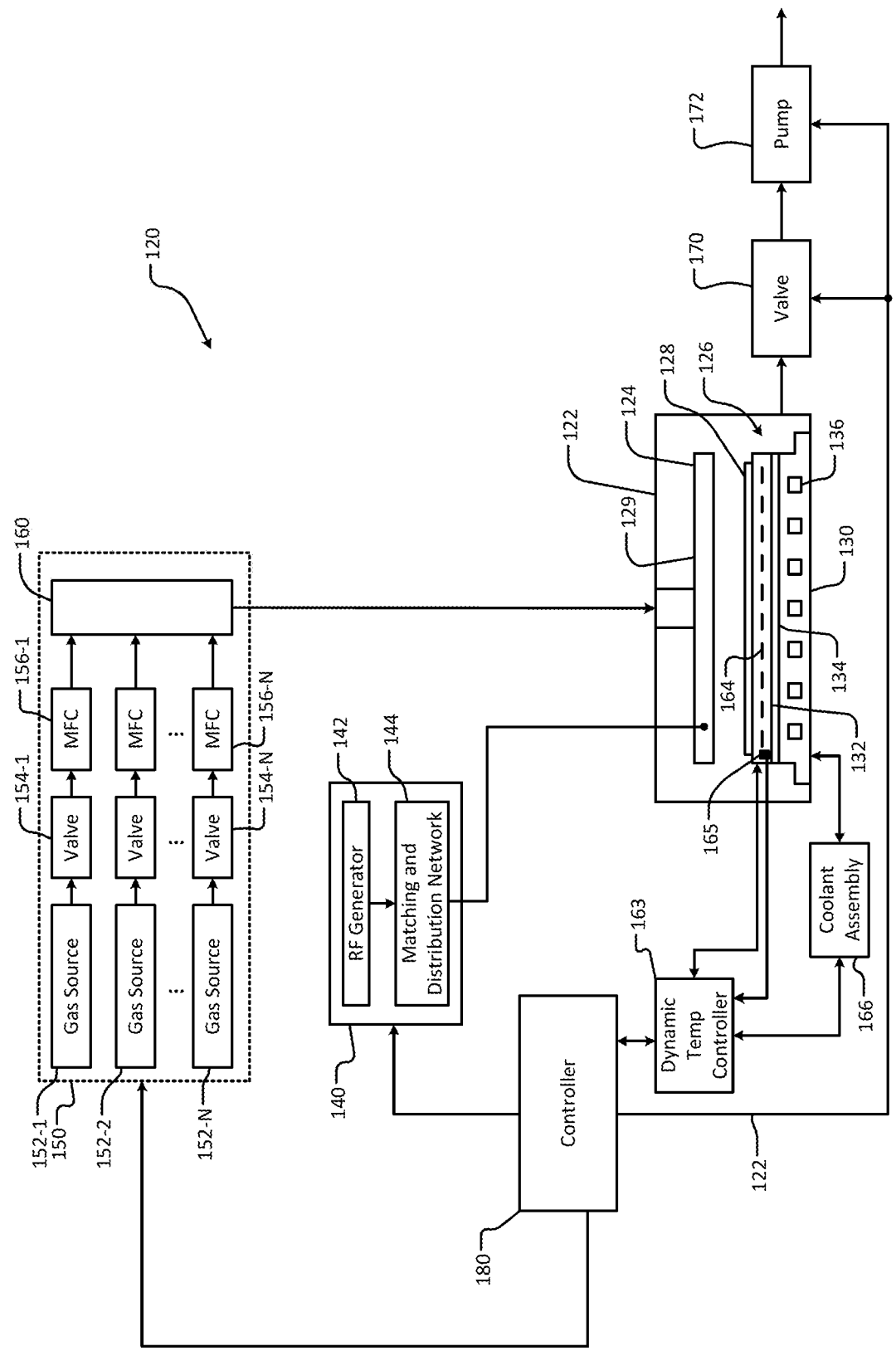
FIG. 1 is a functional block diagram of an example of a substrate processing system including a dynamic temperature controller for a zoned, temperature-controlled component such as a substrate support according to the present disclosure.

While the present disclosure includes specific examples relating to temperature control of multiple zones in a substrate support of a substrate processing system, the systems and methods set forth herein can be applied to control of temperature in other types of components with zoned resistance heating.

In some applications, temperature uniformity is desired across the substrate during substrate processing. In these applications, power may be independently supplied to each of the resistance heaters. However, the multi-zone heater systems often have only a single thermocouple that is located within one of the zones to measure substrate support temperature. Power is supplied to the remaining zones at a predetermined ratio of the power (or power ratio) (or a predetermined ratio of duty cycle) supplied to the zone with the thermocouple to maintain the uniform temperature in all of the zones. The power or duty cycle ratios are typically determined for a specific process condition and generally remain unchanged. The actual temperatures in the remaining zones are unknown but expected to be within a predetermined range of the zone with the thermocouple.

In some applications, however, significant heat load changes can occur during certain process conditions, which can cause the temperatures in one or more zones to change relative to the zone with the thermocouple. The temperature variation leads to undesirable process control. When the temperature variation is sufficiently high, failure of the substrate support can occur.

Some heating systems rely on the dependence of the heater coil resistivity with temperature (or temperature coefficient of resistance (TCR)). These systems generally control individual zone temperatures independently and usually require temperature sensors or thermocouples in each zone. Alternately, individual calibration/characterization of the temperature vs resistance for each heater element and their relation to zone temperature can be determined.

The present disclosure provides a way to circumvent the above requirements while providing temperature uniformity in the zones. The present disclosure maintains thermal uniformity across all of the zones without requiring thermocouples in each zone or individual calibration/characterization as described above.

The TCR is a material property that is related to material micro-structure of the resistance heater. Components made of the same material that are produced under the same processing conditions are expected to have the same or very close TCR values. In other words, heater coil elements used in resistive heaters that are located in different zones of a multi-zone substrate support and that are processed together are expected to have the same or very close TCR values. Although the resistances of the heater elements are likely to be different at any given temperature, the resistances of the heater elements scale similarly with temperature. In other words, each ratio of resistance of the resistance heaters in the zones ($R_{Z1}/R_{ZN}$, $R_{Z2}/R_{ZN}$, ..., and $R_{ZN-1}/R_{ZN}$) without thermocouples (e.g., $R_{Z1}$, $R_{Z2}$, ... $R_{ZN-1}$) relative to the zone with the thermocouple ($R_{ZN}$) will remain the same when the resistance heater is at the same temperature as the resistance heater with the thermocouple. Therefore, if the resistances of the zones are determined at one temperature such as ambient temperature, the corresponding resistance ratios for the zones can be used at other temperatures (e.g., process temperatures in a range from ambient temperature to 700° C.) to determine the desired resistance of the other zones without thermocouples. The desired resistance and the measured resistance are used to control power and to provide a uniform temperature in the other zones.

More particularly, the dynamic temperature controller according to the present disclosure determines N−1 resistance ratios ($R_{Z1}/R_{ZN}$, $R_{Z2}/R_{ZN}$, . . . , and $R_{ZN-1}/R_{ZN}$) of the resistance heaters in the zones without thermocouples ($R_{Z1}$, $R_{Z2}$, . . . $R_{ZN}$−1) relative to the zone with the thermocouple ($R_{ZN}$) at a predetermined temperature. For example, the resistance ratios can be determined at room temperature and applied to other process temperatures. Then, the N−1 resistance ratios ($R_{Z1}/R_{ZN}$, $R_{Z2}/R_{ZN}$, . . . , and $R_{ZN-1}/R_{ZN}$) and the temperature in the zone ZN with the thermocouple are used to determine the desired resistances in the zones without thermocouples ($R_{Z1}$, $R_{Z2}$, . . . $R_{ZN-1}$).

For example, if the resistance ratio for the first zone Z1 is equal to $R_{Z1}/R_{ZN}$=1.102, the measured resistance at a given temperature is 10Ω at the desired temperature in the zone ZN, then the desired resistance for the zone $R_{Z1}$=1.102*10Ω=11.02Ω. For example, if the resistance ratio for the second zone Z2 is equal to $R_{Z2}/R_{ZN}$=1.08, the measured resistance at a given temperature is 10Ω at the desired temperature in the zone ZN with the thermocouple, then the desired resistance in the second zone $R_{Z1}$=1.08*10Ω=10.8Ω.

The systems and methods according to the present disclosure control temperature in multiple zones by maintaining the resistance ratios of the resistance heaters in the zones without thermocouples relative to the zone with the thermocouple. In other words, the temperature of the zone with the thermocouple is controlled to a desired temperature based on the temperature feedback from the thermocouple. The resistance of the zone with the thermocouple is measured at the desired temperature. The resistance ratios are used to determine the desired resistances in the remaining zones to achieve the desired temperatures in the corresponding zones. Heater power is increased or decreased in the corresponding zones to match the measured resistances in the corresponding zones to the desired resistances, respectively.

By using a single measurement of temperature in one zone of the substrate support, all of the remaining zones of the substrate support can be dynamically controlled to the uniform temperature. As a result, substrate support temperature uniformity is achieved without using thermocouples in the remaining zones or prior calibration of resistance vs. temperature for each zone.

Referring now to FIG. 1, an example substrate processing system 120 is shown. While a processing chamber for chemical vapor deposition (CVD) or atomic layer deposition (ALD) using capacitively coupled plasma (CCP) is shown for purposes of illustration, any other type of substrate processing system can be used.

The substrate processing system 120 includes a processing chamber 122 that encloses other components of the substrate processing system 120 and contains the RF plasma (if used). The substrate processing system 120 includes an upper electrode 124 and a substrate support 126 such as an electrostatic chuck (ESC), pedestal, etc. During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

If plasma is used, an RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF generator 142 that generates RF power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and MFCs 156-1, 156-2, . . . , and 156-N (collectively MFCs 156) to a manifold 160. While a single gas delivery system 150 is shown, two or more gas delivery systems can be used.

A dynamic temperature controller 163 is connected to a plurality of resistive heaters 164 arranged in the heating plate 132. The dynamic temperature controller 163 is also connected to a thermocouple 165 arranged in one of a plurality of heating zones in the heating plate 132. The remaining heating zones do not include thermocouples. The dynamic temperature controller 163 may be used to control the plurality of resistive heaters 164 to adjust and control a temperature of the substrate support 126 and the substrate 128.

In some examples, the dynamic temperature controller 163 and/or another controller may also communicate with a coolant assembly 166 to control coolant flow through the channels 136. For example, the coolant assembly 166 may include a coolant pump, a reservoir and/or one or more thermocouples. In some examples, the dynamic temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may be used to control components of the substrate processing system 120.

Figure 2:
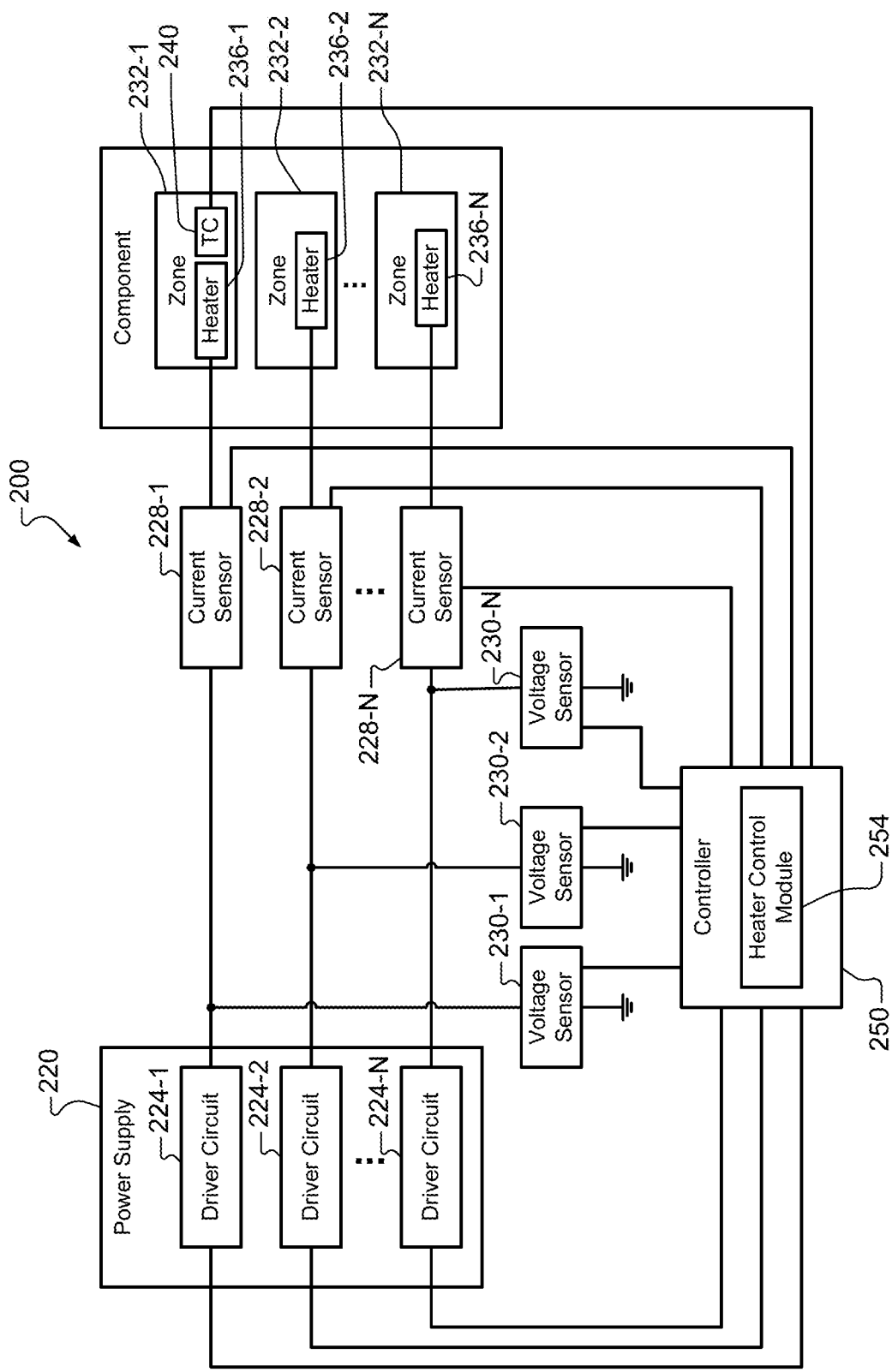
FIG. 2 is a functional block diagram of an example of a dynamic temperature control system for a component with resistive heater zones according to the present disclosure.

Referring now to FIG. 2, a dynamic temperature control system 200 according to the present disclosure is shown. The dynamic temperature control system 200 includes a power supply 220 including driver circuits 224-1, 224-2, ..., and 224-N (collectively driver circuits 224) where N is an integer greater than one. The driver circuits 224 control power to resistive heaters as will be described further below.

Current output by the driver circuits 224-1, 224-2, ..., and 224-N to each of the zones is monitored by current sensors 228-1, 228-2, ..., and 228-N (collectively current sensors 228). Voltage output by the driver circuits 224-1, 224-2, ..., and 224-N to each of the zones is monitored by voltage sensors 230-1, 230-2, ..., and 230-N (collectively voltage sensors 230).

A component 231 includes heated zones 232-1, 232-2, ..., and 232-N (collectively zones 232). In the description that follows, the component 231 includes a substrate support. However, any heated component with multiple zones with resistive heaters can be used. Each of the zones 232-1, 232-2, ..., and 232-N includes a resistive heater 236-1, 232-2, ..., and 232-N (collectively resistive heaters 236) that is embedded therein. In some examples, the resistive heaters 236 include a heater element or coil having a corresponding resistance. One of the zones 232-1, 232-2, ..., and 232-N includes a thermocouple 240 for sensing a temperature thereof. Remaining ones of the zones 232-1, 232-2, ..., and 232-N do not include thermocouples.

The controller 250 communicates with the current sensors 228 and/or the voltage sensors 230, the thermocouple 240 and the driver circuits 224. The controller 250 includes a heater control module 254. The heater control module 254 determines the resistance of each of the resistive heaters 236 based upon the respective current and/or voltage measurements from the current sensors 228 and/or the voltage sensors 230. In some examples, the current sensors 228 can be omitted when the current is held sufficiently constant by the power supply 220 and the voltage is varied to control RF power. In other examples, the voltage sensors 230 can be omitted when the voltage is held sufficiently constant by the power supply 220 and current is varied to control RF power.

The heater control module 254 monitors the temperature of one of the zones 232 with the thermocouple 240 (e.g., the zone 232-1) and controls power to the zone based on the temperature feedback from the thermocouple 240. The heater control module 254 measures the resistance of the zone and uses the resistance ratios to determine desired resistances for the remaining zones 232. The heater control module 254 controls the driver circuits 224 in the remaining zones 232 to increase or decrease power to achieve the desired resistances, which creates a uniform temperature in all of the remaining zones 232.

Figure 3B:
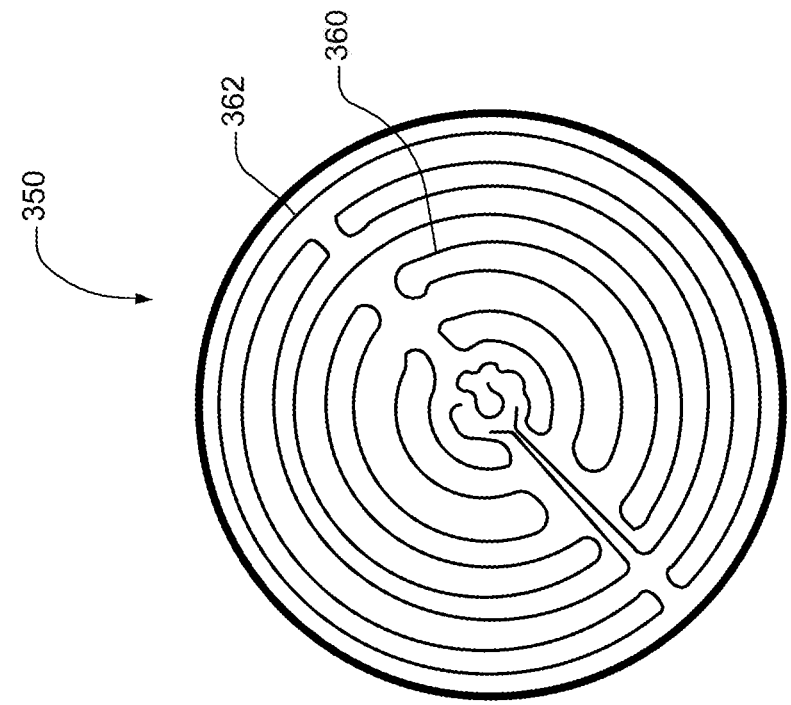
FIGS. 3A to 3C illustrate examples of pedestals including multiple heater zones according to the present disclosure.
Figure 3A:
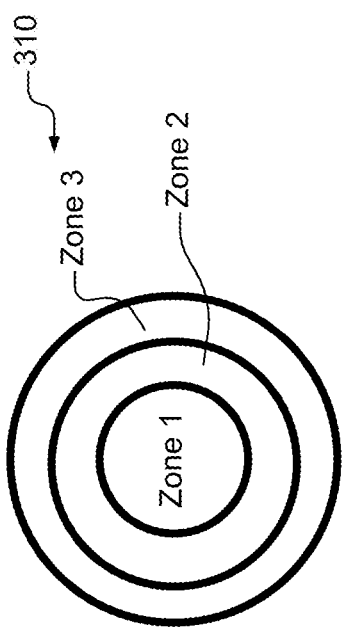
Figure 3C:
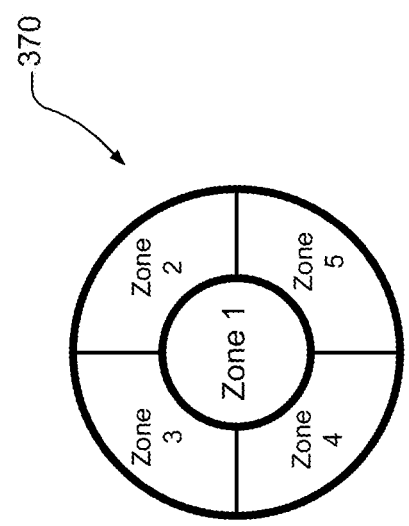

Referring now to FIGS. 3A to 3C, various examples of zones of a substrate support are shown. While specific examples are shown, other zone layouts can be used. In FIG. 3A, a substrate support 310 includes concentric zones including zone 1, zone 2 and zone 3. Each of the zones includes a resistance heater. In FIG. 3B, a substrate support 350 includes resistive heater coils defining an inner zone 360 and an outer zone 362. In FIG. 3C, an inner zone 1 is surrounded by circumferential outer zones 2, 3, 4, and 5. Each of the zones includes a resistance heater. As can be appreciated, other zone layouts can be used.

Figure 4A:
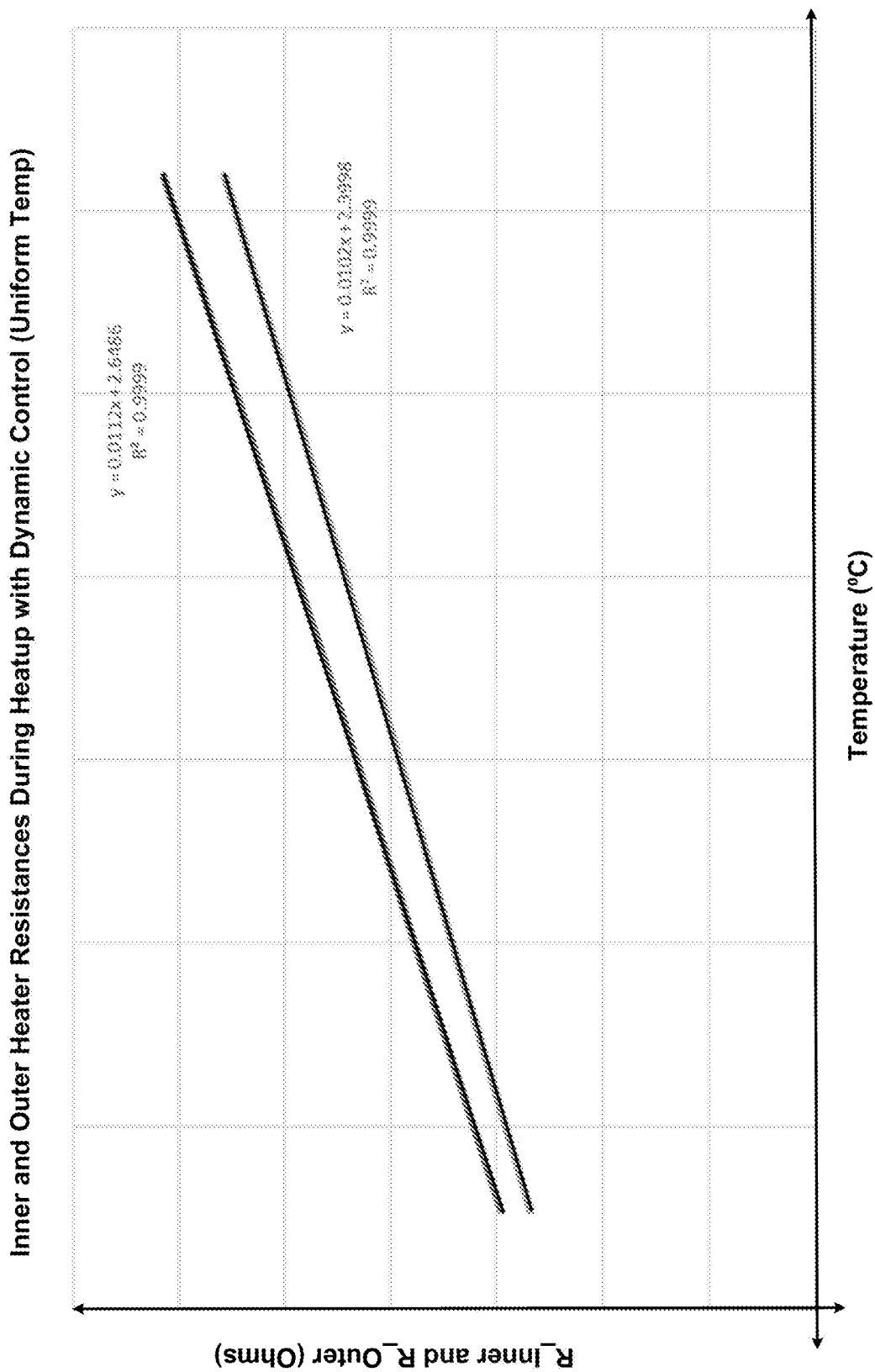
FIGS. 4A and 4B are graph illustrating resistance and resistance ratios as a function of temperature for a two-zone heater according to the present disclosure.
Figure 4B:
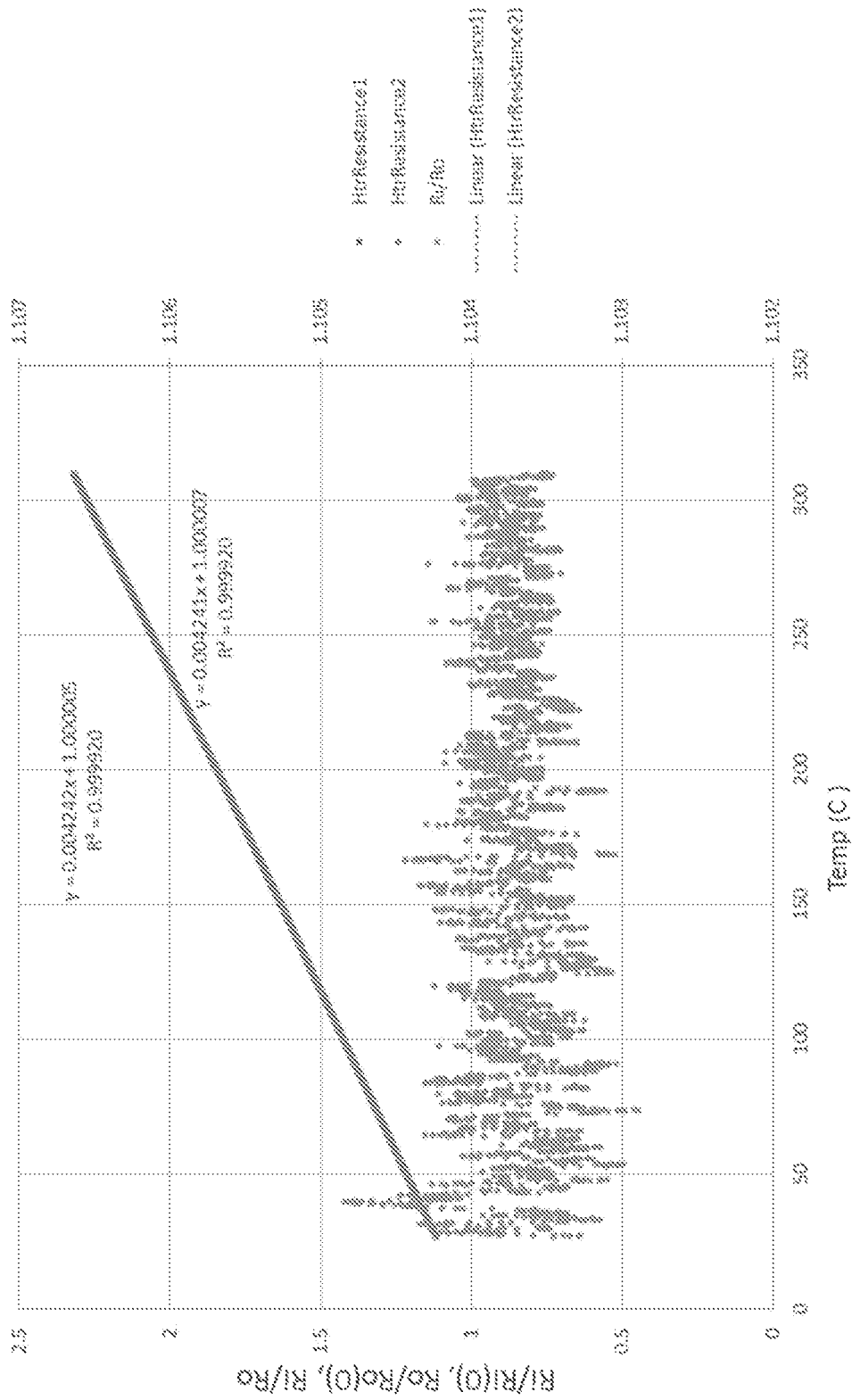

Referring now to FIGS. 4A and 4B, graphs illustrating resistance as a function of temperature for a two-zone heater are shown. In FIG. 4A, inner and outer heater resistances are recorded during pedestal heating using a dynamic temperature controller driven to uniform inner and outer pedestal temperatures based on a TC instrumented wafer on the pedestal. In FIG. 4B, inner and outer resistances are both scaled to resistance of 1 at 0° C. As can be appreciated, the slopes are practically identical. The inner/outer resistance ratio shows a variation of less than 0.05% over the temperature range. These tests support the idea that the inner and outer TCR values are very close to each other and that the resistance ratio can be used to heat pedestal uniformly without calibration.

Figure 5:
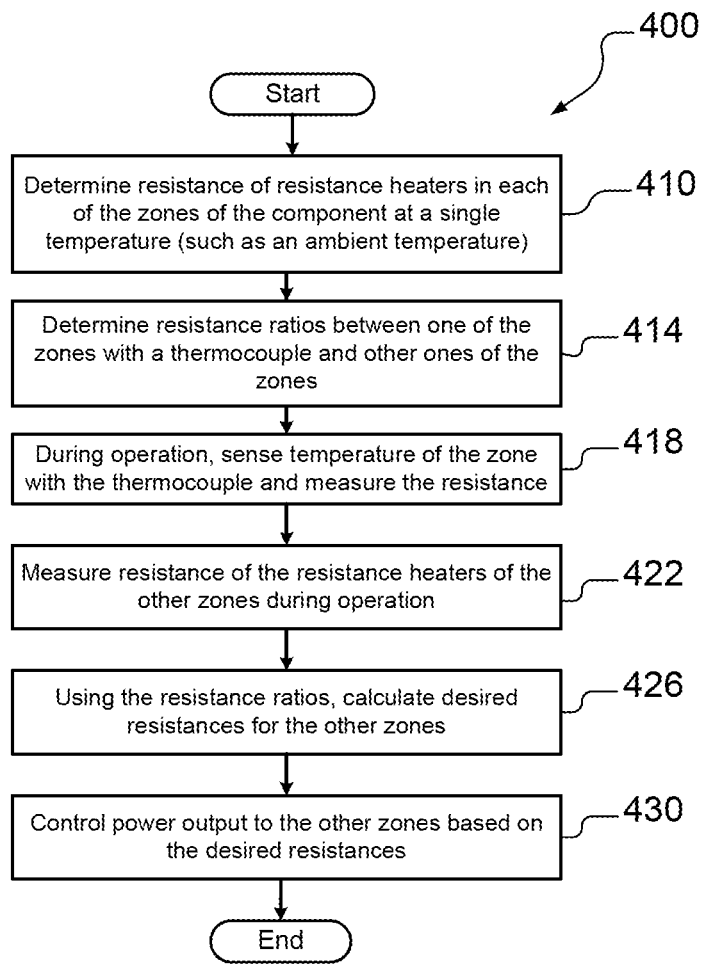
FIG. 5 is a flowchart illustrating an example of a method for performing dynamic temperature control according to the present disclosure.

Referring now to FIG. 5, a method 400 for controlling the temperature of zones of a component is shown, respectively. The method 400 is used to control the temperature of multiples zones of the component to a uniform temperature using a thermocouple associated with only one of the zones. The method 400 includes determining the resistances of the resistance heaters in each of the zones of the component at a single temperature at 410. In some examples, the single temperature is ambient temperature, although other temperatures can be used.

At 414, the method determines resistance ratios between the remaining zones (without a thermocouple) and the zone with the thermocouple. At 418, the temperature of the zone with the thermocouple is sensed during operation, power is controlled based on the measured temperature, and the resistance of the zone with the thermocouple is measured. At 422, the resistances of the resistance heaters in the remaining zones are measured during operation. At 426, the desired resistances for the remaining zones are calculated using the corresponding resistance ratios. At 430, power output to the remaining zones is controlled based on the difference between the measured and desired resistances.

Figure 6:
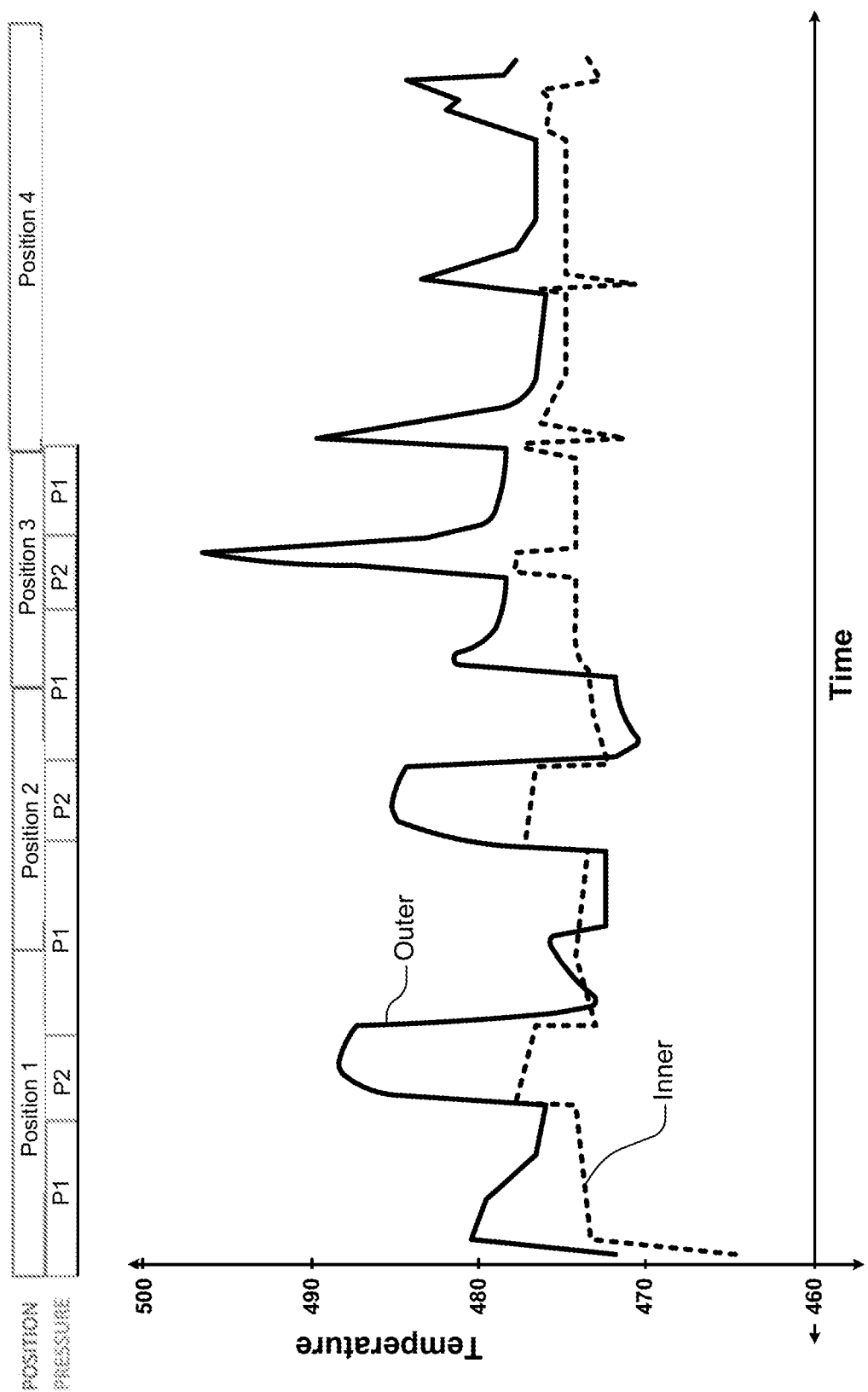
FIG. 6 illustrates control of pedestal temperature as a function of time for a temperature controller according to the prior art.
Figure 7:
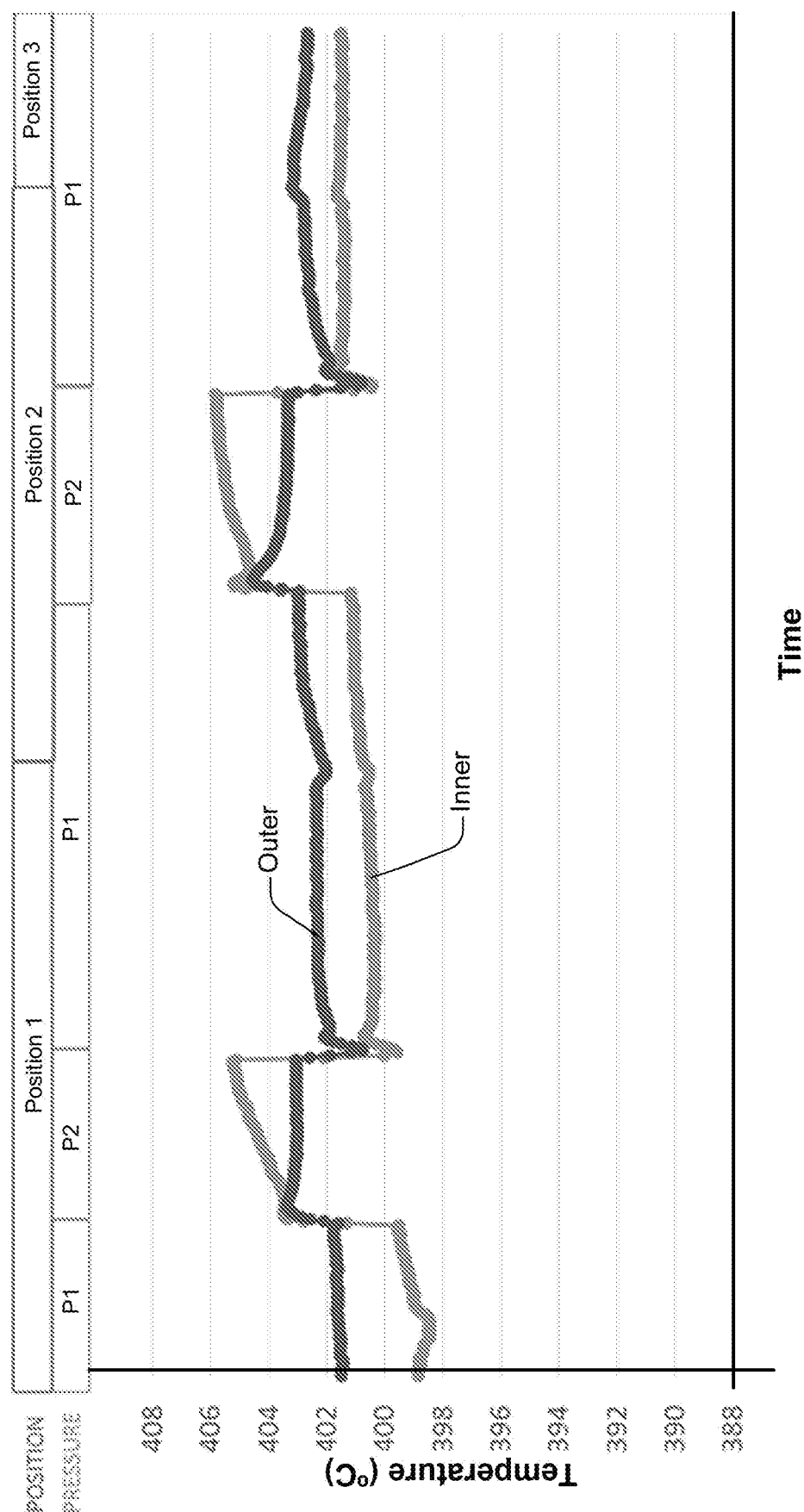
FIG. 7 illustrates control of pedestal temperature as a function of time for the dynamic temperature controller according to the present disclosure.

Referring now to FIGS. 5-6, temperature as a function of time is shown for a convention temperature control system and a dynamic temperature control system according to the present disclosure, respectively. In FIG. 5, temperature is shown as a function of time is shown for the substrate support 350 in FIG. 3B using a conventional temperature control system. As can be seen, the temperature differential between the inner and outer zones is greater than 20° C., which tends to cause process non-uniformity, defects and/or damage to the substrate support. In FIG. 6, much tighter temperature control is achieved using the temperature control system described herein, which reduces process non-uniformity and defects and eliminates damage to the substrate support.

A method of manufacturing a substrate support of a substrate processing system includes embedding N resistive heaters in N zones of a substrate support. A temperature sensor is embedded in one of the N zones of the substrate support. N resistances of the N resistive heaters in the N zones of the substrate support are measured. N−1 resistance ratios are determined based on the N resistances. A controller is connected to the N resistive heaters and the temperature sensor. The controller is programmed to control temperature in N−1 of the N resistive heaters in N−1 of the N zones, respectively, during operation of the substrate processing system in response to a measured temperature in the one of the N zones, the N resistances of the N resistive heaters, and the N−1 resistance ratios.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A temperature-controlled substrate support for a substrate processing system comprising:
a substrate support including N zones and N resistive heaters, respectively, where N is an integer greater than one, and a temperature sensor located in one of the N zones; and a controller configured to:
  calculate N resistances of the N resistive heaters during operation; and
  adjust power to N−1 of the N resistive heaters during operation of the substrate processing system in response to:
    the temperature measured in the one of the N zones by the temperature sensor;
    the N resistances of the N resistive heaters; and
    N−1 resistance ratios.

2. The temperature-controlled substrate support of claim 1, wherein the N−1 resistance ratios are determined by measuring the N resistances of the N resistive heaters in the N zones, respectively, when the substrate support is at a uniform temperature and dividing N−1 of the N resistances of N−1 of the N zones by one of the N resistances corresponding to the one of the N zones.

3. The temperature-controlled substrate support of claim 2, wherein the uniform temperature corresponds to ambient temperature.

4. The temperature-controlled substrate support of claim 1, wherein the N−1 zones do not include temperature sensors.

5. The temperature-controlled substrate support of claim 1, wherein the controller calculates the N resistances of the N resistive heaters during operation by:
  monitoring N voltages supplied to the N resistive heaters, respectively; and
  calculating the N resistances based on the N voltages supplied to the N resistive heaters, respectively.

6. The temperature-controlled substrate support of claim 1, wherein the controller calculates the N resistances of the N resistive heaters during operation by:
  monitoring N currents supplied to the N resistive heaters, respectively; and
  calculating the N resistances based on the N currents supplied to the N resistive heaters, respectively.

7. The temperature-controlled substrate support of claim 1, wherein the controller calculates the N resistances of the N resistive heaters during operation by:
  monitoring N currents and N voltages supplied to the N resistive heaters, respectively; and
  calculating the N resistances based on the N currents and the N voltages supplied to the N resistive heaters, respectively.

8. The temperature-controlled substrate support of claim 1, wherein the controller is configured to control power to the one of the N zones based on the temperature measured by the temperature sensor.

9. A method of manufacturing a temperature-controlled substrate support for a substrate processing system, comprising:
  embedding N resistive heaters in N zones of a substrate support;
  embedding a temperature sensor in one of the N zones of the substrate support;
  measuring N resistances of the N resistive heaters in the N zones of the substrate support;
  determining N−1 resistance ratios based on the N resistances;
  connecting a controller to the N resistive heaters and the temperature sensor; and
  programming the controller to control temperature in N−1 of the N resistive heaters in N−1 of the N zones, respectively, during operation of the substrate processing system in response to:
    a measured temperature in the one of the N zones;
    the N resistances of the N resistive heaters; and
    the N−1 resistance ratios.

10. The method of claim 9, wherein the N−1 resistance ratios are calculated by:
  determining the N resistances of the N resistive heaters, respectively, when the substrate support is at a uniform temperature; and
  dividing the N−1 of the N resistances of the N−1 of the N zones by one of the N resistances corresponding to the one of the N zones.

11. The method of claim 10, wherein the uniform temperature corresponds to ambient temperature.

12. The method of claim 9, wherein the N−1 of the N zones do not include temperature sensors.

13. The method of claim 9, wherein measuring the N resistances of the N resistive heaters includes:
  monitoring N voltages supplied to the N resistive heaters, respectively; and
  calculating the N resistances based on the N voltages supplied to the N resistive heaters, respectively.

14. The method of claim 9, wherein measuring the N resistances of the N zones includes:
  monitoring N currents supplied to the N resistive heaters, respectively; and
  calculating the N resistances based on the N currents supplied to the N resistive heaters, respectively.

15. The method of claim 9, wherein measuring the N resistances of the N zones during operation includes:
  monitoring N currents and N voltages supplied to N resistive heaters, respectively; and
  calculating the N resistances based on the N currents and the N voltages supplied to the N resistive heaters, respectively.

16. A method for controlling temperatures of zones in a substrate support of a substrate processing system, comprising:
  measuring temperature in one of N zones of a substrate support during operation of the substrate processing system using a temperature sensor located in the one of the N zones, where N is an integer greater than one;
  measuring N resistances of N resistive heaters located in the N zones, respectively, during operation of the substrate processing system; and
  adjusting power to N−1 of the N resistive heaters in N−1 of the N zones, respectively, during operation of the substrate processing system to control temperatures in N−1 of the N zones in response to:
    the measured temperature in the one of the N zones;
    the N resistances of the N resistive heaters; and
    N−1 resistance ratios.

17. The method of claim 16, wherein the N−1 resistance ratios are calculated by:
  determining the N resistances of the N resistive heaters, respectively, when the substrate support is at a uniform temperature; and
  dividing N−1 of the N resistances of N−1 of the N zones by one of the N resistances corresponding to the one of the N zones.

18. The method of claim 17, wherein the uniform temperature corresponds to ambient temperature.

19. The method of claim 16, wherein the N−1 of the N zones do not include temperature sensors.

20. The method of claim 16, wherein measuring the N resistances of the N resistive heaters includes:
- monitoring N voltages supplied to the N resistive heaters, respectively; and
- calculating the N resistances based on the N voltages supplied to the N resistive heaters, respectively.

21. The method of claim 16, wherein measuring the N resistances of the N zones includes:
- monitoring N currents supplied to the N resistive heaters, respectively; and
- calculating the N resistances based on the N currents supplied to the N resistive heaters, respectively.

22. The method of claim 16, wherein measuring the N resistances of the N zones during operation includes:
- monitoring N currents and N voltages supplied to N resistive heaters, respectively; and
- calculating the N resistances based on the N currents and the N voltages supplied to the N resistive heaters, respectively.

23. The method of claim 16, further comprising controlling power to the one of the N zones based on the temperature measured by the temperature sensor.

\* \* \* \* \*